US008927189B2

(12) United States Patent
Park et al.

(10) Patent No.: US 8,927,189 B2
(45) Date of Patent: Jan. 6, 2015

(54) PHOTORESIST COMPOSITION AND METHOD OF MANUFACTURING DISPLAY DEVICE USING SAME

(71) Applicant: Samsung Display Co., Ltd., Yongin, Gyeonggi-Do (KR)

(72) Inventors: Gwui-Hyun Park, Hwaseong-si (KR); Pil Soon Hong, Gwangmyeong-si (KR); Jinho Ju, Seol (KR); Taegyun Kim, Yongin-si (KR); Jin-Su Byun, Seongnam-si (KR); Dong Min Kim, Hwaseong-si (KR); Seung Ki Kim, Hwaseong-si (KR); Doo Youn Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/961,458

(22) Filed: Aug. 7, 2013

(65) Prior Publication Data
US 2014/0242515 A1    Aug. 28, 2014

(30) Foreign Application Priority Data
Feb. 27, 2013 (KR) .......................... 10-2013-0021421

(51) Int. Cl.
*G03F 7/023* (2006.01)
*G03F 7/30* (2006.01)
*H01L 21/312* (2006.01)
*G03F 7/008* (2006.01)
*G03F 7/20* (2006.01)

(52) U.S. Cl.
CPC ................ *G03F 7/0085* (2013.01); *G03F 7/20* (2013.01); *G03F 7/0236* (2013.01); *H01L 21/312* (2013.01); *G03F 7/30* (2013.01)
USPC ........... 430/191; 430/192; 430/193; 430/311; 430/317; 430/318

(58) Field of Classification Search
CPC ........ G03F 7/0236; G03F 7/30; H01L 21/312
USPC ............ 430/18, 191, 192, 193, 311, 317, 318
See application file for complete search history.

(56) References Cited

U.S. PATENT DOCUMENTS

| 4,617,251 | A | * | 10/1986 | Sizensky ........................ 430/256 |
| 6,296,992 | B1 | | 10/2001 | Kurihara et al. |
| 6,593,043 | B2 | | 7/2003 | Suwa et al. |
| 7,195,854 | B2 | | 3/2007 | Kang et al. |
| 8,048,615 | B2 | * | 11/2011 | Takei et al. .................... 430/313 |
| 2010/0167476 | A1 | | 7/2010 | Yun et al. |
| 2012/0244471 | A1 | | 9/2012 | Kim et al. |

FOREIGN PATENT DOCUMENTS

| JP | 2002014465 A | 1/2002 |
| JP | 2002062643 A | 2/2002 |
| JP | 2002107925 A | 4/2002 |
| JP | 2005221515 A | 8/2005 |
| JP | 2005258175 A | 9/2005 |
| JP | 2008088197 A | 4/2008 |
| KR | 100725825 B1 | 5/2007 |
| KR | 20110105863 A | 9/2011 |
| KR | 101163052 B1 | 6/2012 |
| KR | 1020120073988 A | 7/2012 |
| WO | 2010050592 A1 | 5/2010 |

* cited by examiner

*Primary Examiner* — John Chu
(74) *Attorney, Agent, or Firm* — Cantor Colburn LLP

(57) ABSTRACT

A photoresist composition including a binder resin including a novolac resin represented by Chemical Formula 1, a diazide photosensitive initiator, and a solvent including a base solvent and an auxiliary solvent, wherein the base solvent includes propylene glycol monomethyl ether acetate, and the auxiliary solvent includes dimethyl-2-methylglutarate and ethyl beta-ethoxypropionate, Chemical Formula 1

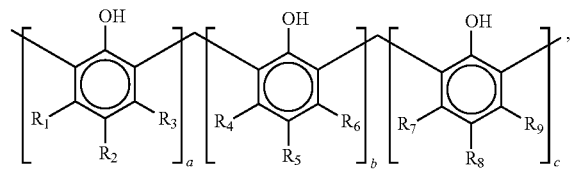

wherein in Chemical Formula 1, $R_1$ to $R_9$ are each independently a hydrogen atom or an alkyl group, "a" is an integer number from 0 through 10, "b" is an integer number from 0 through 100, and "c" is an integer number from 1 through 10.

22 Claims, 12 Drawing Sheets

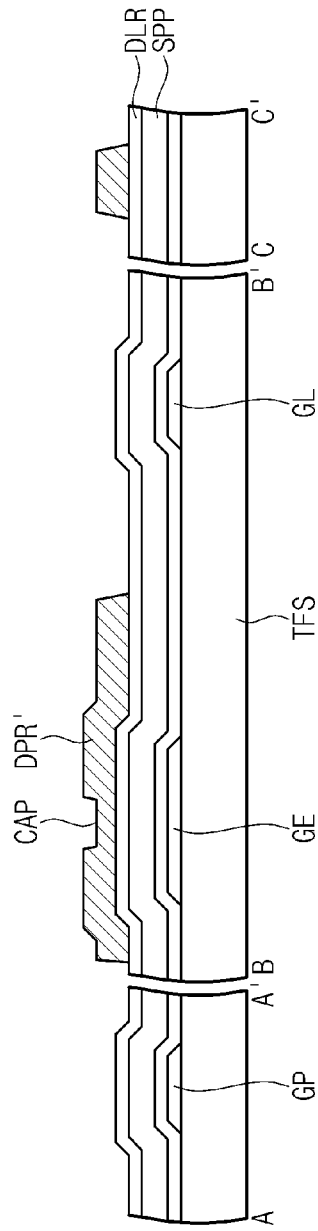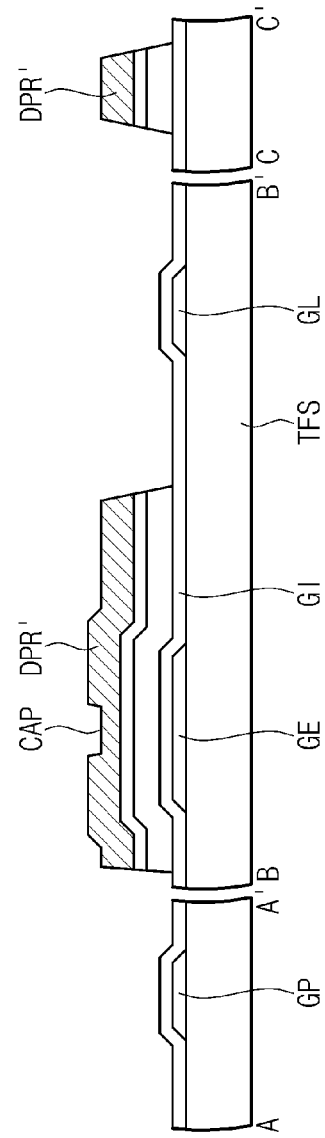

| Focal Length | 0 μm | 10 μm | 20 μm | 30 μm | 40 μm |
|---|---|---|---|---|---|
| Comparative example 3 | 3.01 | 3.04 | 3.06 | 3.33 | 3.60 |
| Embodiment example 7 | 2.98 | 3.06 | 3.02 | 3.08 | 3.39 |

PHOTORESIST COMPOSITION AND METHOD OF MANUFACTURING DISPLAY DEVICE USING SAME

This application claims priority to and benefit of Korean Patent Application No. 10-2013-0021421, filed on Feb. 27, 2013, and all the benefits accruing therefrom under 35 U.S.C. §119, the content of which is incorporated herein in its entirety by reference.

BACKGROUND

1. Field of Disclosure

The present disclosure relates to a photoresist composition and a method of manufacturing a display device using the same. More particularly, the present disclosure relates to a photoresist composition capable of forming a uniform pattern and a method of manufacturing the display device using the photoresist composition.

2. Description of the Related Art

In recent years, various flat display devices including a liquid crystal display device, organic electroluminescent display device, and plasma display panel have been developed. A typical flat display device includes a fine circuit pattern formed by a photolithography process. To perform the photolithography process, a photoresist material and a mask are ordinarily used. In particular, when a laser beam is provided to the mask wherein a shape corresponding to the fine circuit pattern has been formed, the laser beam passing through the mask, irradiates the photoresist material coated on a substrate, thereby forming a photoresist pattern on the substrate. After an etch process is performed on the substrate containing the photoresist pattern, the fine circuit pattern is formed.

The photoresist material usually includes a polymer, a photosensitizer, and a solvent. The polymer remains in the photoresist pattern after the latter had been developed. The photosensitizer transfers energy of applied light to the polymer, which may cause the polymer to melt while the photoresist material is developed by an etchant. The choice of the solvent is determined by the viscosity of the photoresist material so that the photoresist material may be easily coated on a substrate.

The photoresist material is classified into a positive type photoresist material and a negative type photoresist material, and the positive type photoresist material includes a novolac resin.

Despite the existence of different types of photoresist materials, there remains a need for a photoresist composition capable of improving a margin of a focus depth and pattern profile.

SUMMARY

The present disclosure provides a photoresist composition capable of improving a margin of a focus depth and a pattern profile and preventing stains from occurring.

The present disclosure also provides a method of manufacturing a display device using the photoresist composition.

An embodiment concept provides a photoresist composition including a binder resin including
 a novolac resin represented by Chemical Formula 1,
 a diazide photosensitive initiator, and
 a solvent including
  a base solvent and
  an auxiliary solvent,
 wherein the base solvent includes propylene glycol monomethyl ether acetate and
 wherein the auxiliary solvent includes dimethyl-2-methylglutarate and ethyl beta-ethoxypropionate,

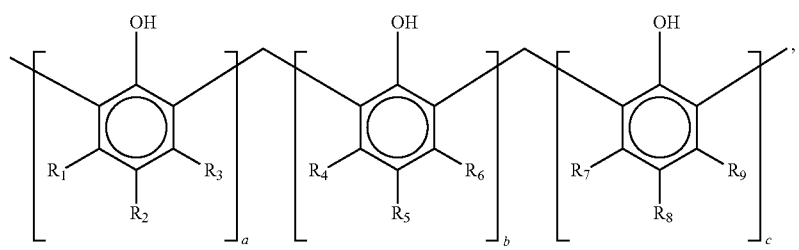

Chemical Formula 1 wherein in Chemical Formula 1, $R_1$ to $R_9$ are each independently a hydrogen atom or an alkyl group, "a" is an integer number from 0 through 10, "b" is an integer number from 0 through 100, and "c" is an integer number from 1 through 10.

In an embodiment, a content of the propylene glycol monomethyl ether acetate is about 70 weight % to about 90 weight %, a content of the dimethyl-2-methylglutarate is about 2 weight % to 15 weight %, and a content of the ethyl beta-ethoxypropionate is about 5 weight % to about 15 weight % based on a total of 100 weight % of the solvent.

The novolac resin includes
 a first novolac resin and
 a second novolac resin,
 wherein in the first novolac resin is a product of polymerization of meta-cresol and para-cresol, and
 wherein the second novolac resin is a product of polymerization of meta-cresol, para-cresol, and a trimethylphenol.

In an embodiment, a content of meta-cresol is about 30 weight % to about 60 weight % and a content of para-cresol is about 40 weight % to about 70 weight % based on a total of 100 weight % of the first novolac resin.

In another embodiment, a content of meta-cresol is about 30 weight % to about 60 weight %, a content of para-cresol is about 30 weight % to about 60 weight %, and a content of the trimethylphenol is about 10 weight % to about 40 weight % based on a total of 100 weight % of the second novolac resin.

In another embodiment, a content of the first novolac resin is about 1 weight % to about 50 weight % and a content of the second novolac resin is about 50 weight % to about 99 weight % based on a total of 100 weight % of the novolac resin.

The diazide photosensitive initiator includes 2,3,4,4'-tetrahydroxybenzophenone-1,2-naphtoquinone diazide-5-sulfonate and further includes 2,3,4-trihydroxybenzophenone-1,2-naphtoquinonediazide-5-sulfonate.

In an embodiment, a content of the binder resin is about 10 weight % to about 38 weight %, a content of the diazide photosensitive initiator is about 2 weight % to about 10 weight %, and the content of the solvent is about 60 weight % to about 80 weight % based on a total of 100 weight % of the photoresist composition.

An embodiment provides a method of manufacturing a display device including forming a plurality of pixels on a thin film transistor substrate, forming a liquid crystal layer on the thin film transistor substrate, and forming a color filter substrate on the liquid crystal layer.

The plurality of pixels is formed by a photolithography process using a photoresist composition. The photolithography process includes forming a conductive or non-conductive layer, forming a photoresist layer on the conductive or non-conductive layer using the photoresist composition, exposing and developing the photoresist layer to form a photoresist pattern, and etching the conductive or non-conductive layer using the photoresist pattern.

The forming of the photoresist layer includes removing a portion of the solvent using a soft bake process. In an embodiment, the photoresist composition is a positive type photoresist composition to allow wherein the positive type photoresist composition undergoes removal of an exposed portion of the photoresist layer after the photoresist layer is developed.

According to the above, the contents of the binder resin and the solvent in the photoresist composition are adjusted, the depth of focus ("DOF") margin and the exposure latitude ("EL") margin of the photoresist pattern are improved and the variation of the critical dimension ("CD") is reduced. Thus, the pattern profile of the resulting photoresist pattern is improved and the stains are prevented from occurring.

BRIEF DESCRIPTION OF THE DRAWINGS

The above and other advantages will become readily apparent by reference to the following detailed description when considered in a conjunction with the accompanying drawings wherein:

FIGS. 3 to 13 are cross-sectional views showing a method of manufacturing a display device according to an exemplary embodiment;

DETAILED DESCRIPTION

Figure 1:
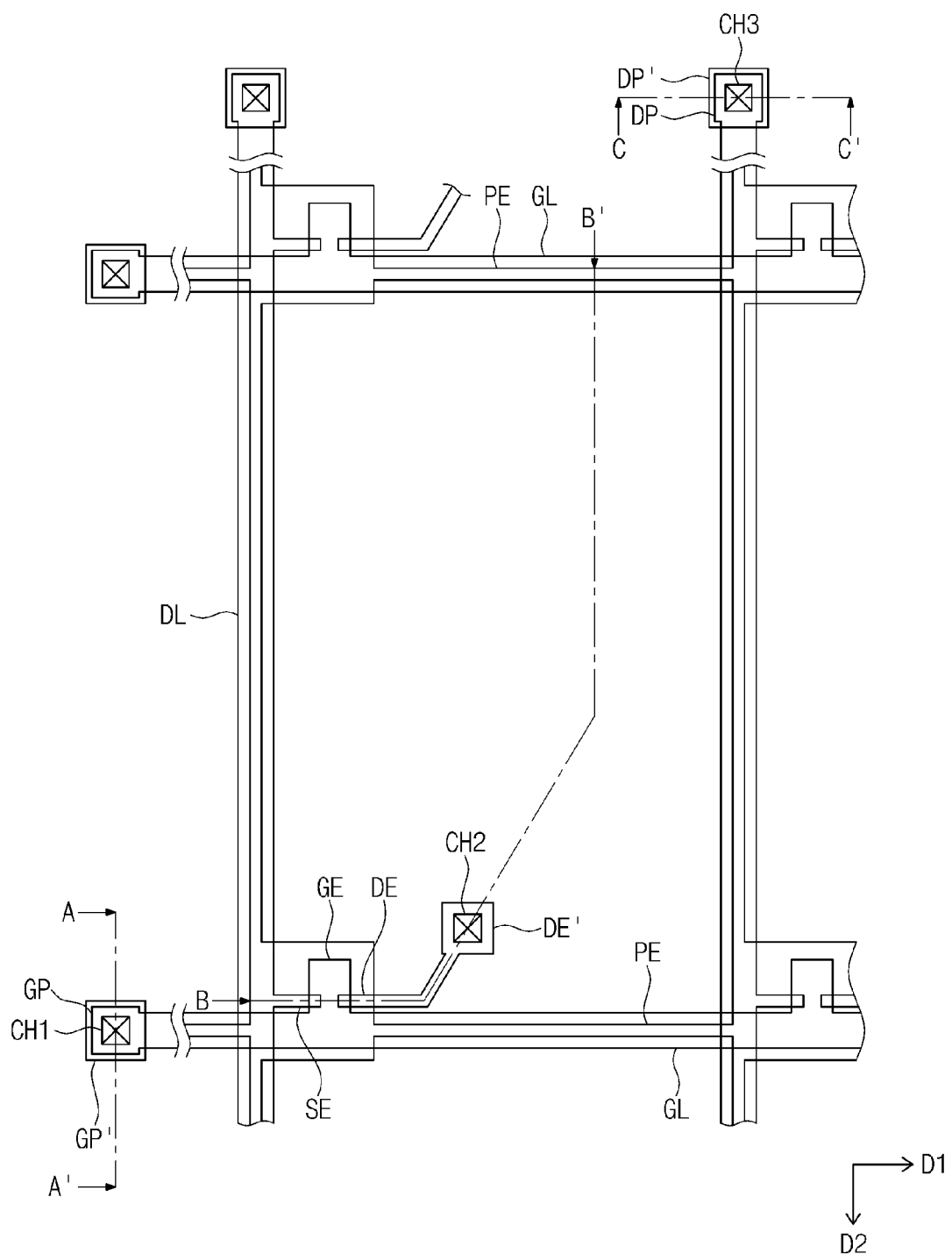
FIG. 1 is a plan view showing only one pixel of a display device according to an exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a photoresist composition will be explained in detail according to exemplary embodiments.

The photoresist composition according to an exemplary embodiment may be used to perform a photolithography process. In detail, the photoresist composition may be used to perform the photolithography process using a Canon exposure system.

The photoresist composition may include a binder resin containing a novolac resin represented by the following Chemical Formula 1, a diazide photosensitive initiator, and a solvent. The solvent may include a base solvent and an auxiliary solvent. The base solvent may include propylene glycol monomethyl ether acetate ("PGME") and the auxiliary solvent may include dimethyl-2-methylglutarate ("DMMGA") and ethyl beta-ethoxypropionate ("EEP").

Chemical Formula 1

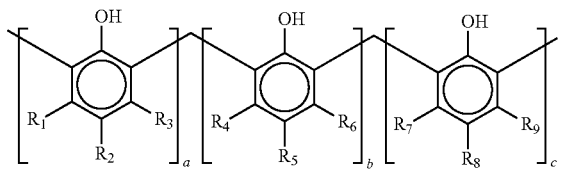

In Chemical Formula 1, $R_1$ to $R_9$ are each independently a hydrogen atom or an alkyl group, "a" is an integer number from 0 through 10, "b" is an integer number from 0 through 100, and "c" is an integer number from 1 through 10.

The novolac resin may include a first novolac resin and a second novolac resin. The first novolac resin may be a product obtained by polymerization of meta-cresol and para-cresol, and the second novolac resin may be a product obtained by polymerization of meta-cresol, para-cresol, and a trimethylphenol.

The first and second novolac resins may include a hydroxyl group and are soluble in an aqueous alkali developing solution and are insoluble in water.

An average molecular weight of each of the first and second novolac resins may be in a range from about 2,000 to about 20,000. When the average molecular weight of the compound represented by the first and second novolac resins is equal to or smaller than 2,000, a viscosity needed to perform the photolithography process may not be achieved and a solubility of the compound represented by the first and second novolac resins may become high with respect to the developing solution. As a result, a desired pattern profile may not be realized. On the other hand, when the average molecular weight of the compound represented by the first and second novolac resins is equal to or greater than 20,000, the viscosity may become higher than the viscosity required for the photolithography process, and the photoresist pattern may not be easily separated.

The first novolac resin may be represented by the following Chemical Formula 2.

Chemical Formula 2

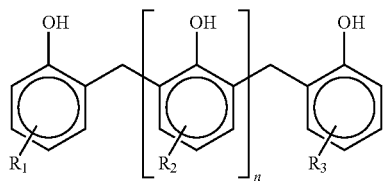

In Chemical Formula 2,
n is an integer number from 1 through 100,
$R_1$ to $R_3$ are each at least one selected from a hydrogen atom, an alkyl group, an alkoxy group, a halogen atom, or a nitride group.

The first and second novolac resins may be obtained by reacting a phenol compound with an aldehyde compound or a ketone compound in the presence of an acid catalyst.

The phenol compound may include one or more of phenol, o-cresol, m-cresol, p-cresol, o-ethylphenol, m-ethylphenol, p-ethyphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethylether, bisphenol-A, α-naphthol, and β-naphthol.

The aldehyde compound may include one or more of formaldehyde, formalin, p-formaldehyde, trioxane, acetaldehyde, propyl aldehyde, benzaldehyde, phenyl acetaldehyde, α-phenyl propylaldehyde, β-phenyl propylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-n-butylbenzaldehyde, and terephthalaldehyde.

The ketone compound may include one or more of acetone, methylethyl ketone, diethyl ketone, and diphenyl ketone.

In addition, the acid catalyst may include a hydrochloric acid, a nitric acid, a sulfuric acid, a formic acid, or an oxalic acid.

Trimethylphenol, the molecule of which has an additional methyl group as compared to meta-cresol or para-cresol, has hydrophobicity greater than that of meta-cresol or para-cresol. In addition, the photoresist composition containing the trimethylphenol residue has lower reactivity with respect to light, than the photoresist composition containing only meta-cresol or para-cresol residues. The trimethylphenol may be 2,3,4-trimethylphenol, 2,3,5-trimethylphenol, 2,3,6-trimethylphenol, 2,4,6-trimethylphenol, or a combination thereof. Accordingly, the second novolac resin may have a higher retention rate than the first novolac resin in a non-exposure area, the photoresist composition containing the second novolac resin may have relatively high coherence, and the photoresist composition containing the second novolac resin may be relatively insensitive to the exposure device. Therefore, the second novolac resin may have a broader margin of depth of focus ("DOF") than the margin of depth of focus of the first novolac resin.

In addition, meta-cresol residue of the first and second novolac resins has a tendency to increase sensitivity of the photoresist composition with respect to the light, and paracresol residue of the first and second novolac resins has a tendency to decrease the sensitivity of the photoresist composition with respect to the light. The term "sensitivity" as used herein means the degree of the reaction of the photoresist composition with respect to the light which the photoresist composition is exposed to. Thus, when even a relatively small amount of the light is applied, the photoresist composition having the high sensitivity may be completely exposed to the light compared to the photoresist composition having the low sensitivity. That is, an energy latitude ("EL") margin of such a photoresist composition would be high.

Therefore, when the photoresist composition includes the trimethylphenol residues and high-rate para-cresol residues, the DOF margin and the EL margin of such a composition become high.

In other words, when a weight percent of meta-cresol and para-cresol residues in the first novolac resin and a weight percent of meta-cresol, para-cresol, and the trimethylphenol residues in the second novolac resin are properly controlled, the sensitivity, the DOF margin, and the EL margin of the photoresist composition may be improved.

In addition, when a content of the binder resin in the photoresist composition exceeds about 40 weight %, the rate of dissolution of the photoresist composition in the developing solution may be slower. Accordingly, the time required to perform the exposure process may be increased, and thus the whole time needed to form a thin film pattern may be greater.

On the other hand, when the content of the binder resin is less than about 5 weight %, the rate of dissolution of the photoresist composition in the developing solution may be faster. As a result, the retention rate of the thin film pattern may be lower.

Accordingly, the content of the binder resin is preferably about 10 weight % to about 38 weight % based on a total of 100 weight % of the photoresist composition.

For instance, when the content of the novolac resin is assumed to be 100 weight %, the content of the first novolac resin may be about 1 weight % to about 50 weight % and the content of the second novolac resin may be about 99 weight % to about 50 weight %. In addition, when the content of the novolac resin is assumed to be 100 weight %, the content of the first novolac resin is about 40 weight % and the content of the second novolac resin is about 60 weight %.

When the content of the first novolac resin is assumed to be 100 weight %, the content of meta-cresol may be about 30 weight % to about 60 weight % and the content of para-cresol may be about 70 weight % to about 40 weight %. In addition, when the content of the first novolac resin is assumed to be 100 weight %, the content of meta-cresol may be about 40 weight % and the content of para-cresol may be about 60 weight %.

When the content of the second novolac resin is assumed to be 100 weight %, the content of meta-cresol may be about 30 weight % to about 60 weight %, the content of para-cresol may be about 30 weight % to about 60 weight %, and the content of the trimethylphenol may be about 10 weight % to about 40 weight %. In addition, when the content of the second novolac resin is assumed to be 100 weight %, the content of meta-cresol may be about 40 weight %, the content of para-cresol may be about 60 weight %, and the content of the trimethylphenol may be about 20 weight %.

The photosensitive initiator may be, but is not limited to, a diazide compound. The diazide photosensitive initiator may include 2,3,4,4'-tetrahydroxybenzophenone-1,2-naphtoquinone diazide-5-sulfonate (hereinafter, referred to as diazide compound 1) represented by the following Chemical Formula 3. In addition, the diazide photosensitive initiator may further include 2,3,4-trihydroxybenzophenone-1,2-naphtoquinonediazide-5-sulfonate (hereinafter, referred to as diazide compound 2) represented by the following Chemical Formula 4. The diazide compound 1 and the diazide compound 2 may be independently used or mixed with each other.

Chemical Formula 3

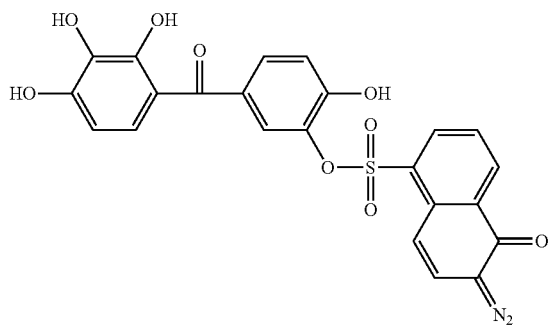

Chemical Formula 4

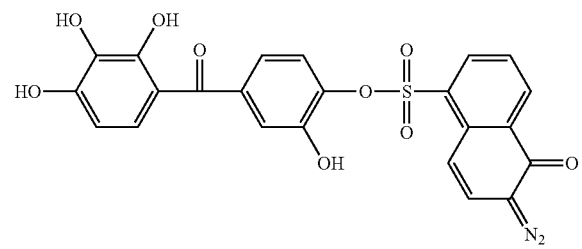

In this embodiment, when a content of the diazide photosensitive initiator exceeds about 10 weight % based on a total of 100 weight % of the photoresist composition, it may be difficult to form the thin film pattern at a desired exposure energy band since the energy of the exposure is considerably consumed in a light source. On the other hand, when the content of the diazide photosensitive initiator is less than about 2 weight % based on a total of 100 weight % of the photoresist composition, it may be difficult to form the thin film pattern at the desired exposure energy band since the photoresist composition tends to be exposed to only a small amount of the exposure energy. Accordingly, when the content of the photoresist composition is assumed to be 100 weight %, the content of the diazide photosensitive initiator may be about 2 weight % to about 10 weight %.

The solvent may include the base solvent and the auxiliary solvent. In the present exemplary embodiment, the solvent from the photoresist composition may be removed by soft baking in a soft baking apparatus.

The soft baking apparatus includes a hot plate including a heating portion that applies heat to a first substrate on which the photoresist composition is coated, wherein a patterning process is performed using the photoresist composition and a hole portion at which a support pin is arranged to uniformly maintain a distance between the heating portion and the first substrate. In this embodiment, the temperature of the hole portion may be, e.g., about 99 degrees Centigrade, which is different from a temperature of the heating portion, which may be, e.g., about 105 degrees Centigrade. Due to this temperature difference, a portion of the first substrate, which is adjacent to the hole portion, may be different from a portion of the first substrate, which is adjacent to the heating portion. As a result, the degree of drying of the photoresist composition coated in the area corresponding to the hole portion is different from the degree of drying of the photoresist composition coated in the area corresponding to the heating portion, thereby causing deformation of and stains on the photoresist layer during the photolithography process.

Accordingly, the boiling point of the solvent may be increased such that the coating layer is not influenced by the temperature difference even though the temperature difference occurs in the soft baking apparatus.

In addition, the solvent may be a compound having a boiling point of about 110 degrees Centigrade to about 250 degrees Centigrade under an atmospheric pressure. In an embodiment, the etching process that utilizes the photoresist composition may be performed at a temperature from about 100 degrees Centigrade to about 150 degrees Centigrade. However, when the boiling point of the solvent is less than about 110 degrees Centigrade, a property of the photoresist layer may be degraded, e.g., a surface of the photoresist layer may become rough, during the soft baking process since the solvent in the photoresist layer is drying too fast. In addition, when the boiling point of the solvent exceeds about 250 degrees Centigrade, an excellent surface flatness of the photoresist layer may not be realized since an amount of the solvent remaining in the photoresist layer increases and the photoresist layer shrinks substantially during a curing process. Therefore, the boiling point of the solvent is set to about 110 degrees Centigrade to about 250 degrees Centigrade, and thus the photoresist layer is appropriately dried and the coating layer has the excellent surface flatness.

As the base solvent, propylene glycol monomethyl ether acetate (hereinafter, referred to as "PGMEA") may be used, which have the boiling point of about 146 degrees Centigrade. The auxiliary solvent may be obtained by mixing dimethyl-2-methylglutarate (hereinafter, referred to as "DMMGA") having the boiling point of about 220 degrees Centigrade higher than that of PGMEA with PGMEA and adding ethyl beta-ethoxypropionate (hereinafter, referred to as "EEP") having the boiling point of about 167 degrees Centigrade to the mixture of PGMEA and DMMGA to reduce a boiling point difference between PGMEA and DMMGA. That is, a three-component solvent system of PGMEA, DMMGA, and EEP is used as the solvent of the photoresist composition.

In the present exemplary embodiment, the content of the solvent may be about 60 weight % to about 80 weight % based on a total of 100 weight % of the photoresist composition. When the content of the solvent exceeds about 90 weight %, the retention rate may be lowered, and the solvency of the solvent with respect to the binder resin and the diazide photosensitive initiator may be diminished when the content of the solvent is less than about 60 weight %.

In addition, when the content of the solvent is assumed to be 100 weight %, a content of PGMEA may be about 70 weight % to about 90 weight %, a content of DMMGA may be about 2 weight % to about 15 weight %, and a content of EEP may be about 5 weight % to about 15 weight %.

The photoresist composition of the present exemplary embodiment may further include at least one selected from a coloring agent, a dye, a striation preventing agent, a plasticizer, an adhesion accelerant, or a surfactant. The surfactant may improve a coating property of the photoresist composition.

Hereinafter, a method of manufacturing a display device will be described in detail with reference to FIGS. 1 to 13.

Figure 2:
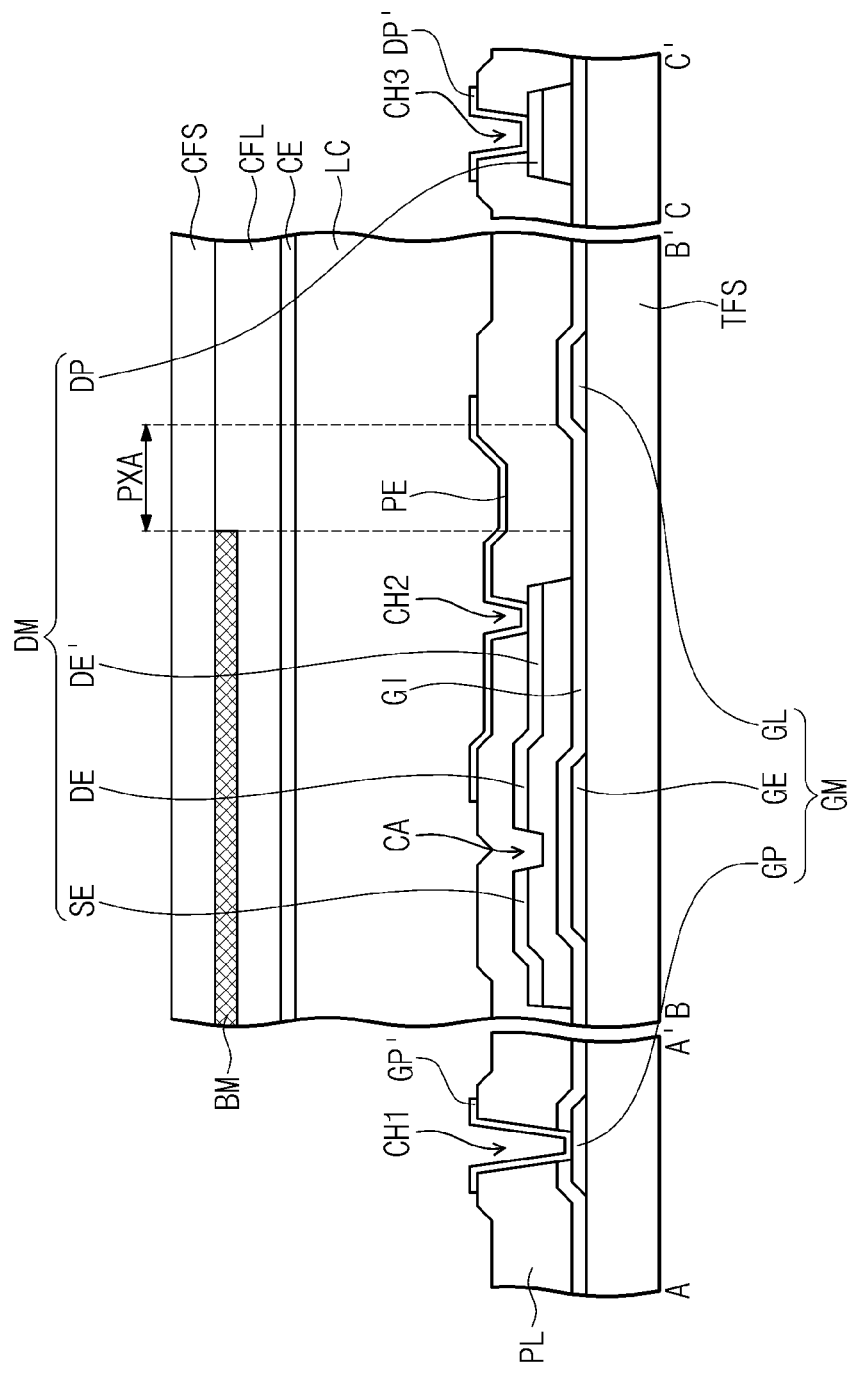
FIG. 2 is a cross-sectional view of the only one pixel of a display device of FIG. 1 taken along lines A-A', B-B', and C-C'.

FIG. 1 is a plan view showing only one pixel of a display device according to an exemplary embodiment and FIG. 2 is a cross-sectional view taken along lines A-A', B-B', and C-C' of FIG. 1.

Referring to FIGS. 1 and 2, the display device includes a thin film transistor substrate TFS on which a plurality of pixels PXL is arranged, a liquid crystal layer LC disposed on the thin film transistor TFS, and a color filter substrate CFS disposed on the liquid crystal layer LC.

Each pixel PXL includes a gate line part GM, a gate insulating layer GI, a semiconductor layer SP, a data line part DM, a pixel electrode PE, and a liquid crystal layer LC, which are sequentially stacked on the thin film transistor substrate TFS. In addition, a driving part (not shown) may be disposed on the thin film transistor substrate TFS except for the pixels PXL.

The gate line part GM includes a gate line GL, a gate electrode GE, and a gate pad GP. The gate line GL is provided in a plural number on the thin film transistor substrate TFS, and the gate lines GL are extended in a first direction D1. The gate pad GP is disposed at an end portion of the gate line GL and protruded from the gate line GL.

The gate pad GP receives a gate signal from the gate driver and applies the gate signal to the gate line GL.

The gate insulating layer GI and the semiconductor layer SP are sequentially disposed on the gate line part GM.

The data line part DM includes a data line DL, a data pad DP, a source electrode SE, and a drain electrode DE. The data line DL is disposed on the thin film transistor substrate TFS and extended in a second direction D2 to cross the gate line GL.

The data pad DP is disposed at an end portion of the data line DL and receives an image signal from an external source (not shown) to apply the image signal to the data line DL.

The source electrode SE is branched from the data line DL and has various shapes. The drain electrode DE is separated from the source electrode SE, and a portion of the semiconductor layer SP, which is exposed through between the source and electrodes SE and DE, serves as a channel portion CA. A signal provided through the data line DL is applied to the drain electrode DE through the channel portion CA.

A passivation layer PL is disposed on the data line part DM and the gate insulating layer GI. The passivation layer PL is provided with a first contact hole CH1 formed therethrough to expose a portion of the gate pad GP, a second contact hole CH2 formed therethrough to expose a portion of the drain electrode DE, e.g., an expansion portion DE' of the drain electrode DE, and a third contact hole CH3 formed therethrough to expose a portion of the data pad DP.

An auxiliary gate pad GP' is disposed on the passivation layer PL in an area corresponding to the gate pad GP to make contact with the gate pad GP through the first contact hole CH1. In addition, a pixel electrode PE is disposed on the passivation layer PL in an area in which the data line DL crosses the gate line GL to make contact with the expansion portion DE' of the drain electrode DE. Further, an auxiliary data pad DP' is disposed on the passivation layer PL in an area corresponding to the data pad DP to make contact with the data pad DP through the third contact hole CH3.

The liquid crystal layer LC is disposed on the thin film transistor substrate TFS and the color filter substrate CFS is disposed on the liquid crystal layer LC.

A black matrix BM, a color filter CFL, and a common electrode CE are sequentially disposed on the color filter substrate CFS, and the color filter substrate CFS is coupled to the thin film transistor substrate TFS to allow the common electrode CE to face the thin film transistor substrate TFS.

The black matrix BM is disposed on the gate line part GM and the data line part DM and blocks an external light from being irradiated onto the gate line part GM and the data line part DM, thereby preventing a current leakage from occurring and the pixel PXL from malfunctioning. In addition, the black matrix BM covers portions between the pixel electrode PE and the gate line GL and between the pixel electrode PE and the data line DL to prevent the light emitted from a light source (not shown) disposed under the thin film transistor substrate TFS from being leaked through the portions between the pixel electrode PE and the gate line GL and between the pixel electrode PE and the data line DL.

Therefore, an area not covered by the black matrix BM serves as a pixel area PXA in which the image is displayed without being blocked.

In FIG. 2, the pixel area PXA has been shown to have a narrow size, but the size of the pixel area PXA should not be limited thereto or thereby.

The color filter CFL includes red, green, and blue color resists each containing pigment to display colors, which are arranged in a regular order.

The display device may be, but not limited to, a patterned vertical alignment ("PVA") mode display device to secure a wide viewing angle. In this embodiment, a manufacturing method of the PVA mode display device may further include patterning processes to form openings through the pixel electrode PE of the thin film transistor substrate TFS and openings through the common electrode CE. Thus, a plurality of microslit patterns may be formed through the pixel electrode PE.

In addition, the expansion portion DE' of the drain electrode DE forms a capacitor (not shown) together with other elements disposed thereon. In a case that one pixel area PXA includes two sub-pixel areas, the capacitor serves as a coupling capacitor to allow the sub-pixels to be applied with different voltages.

Hereinafter, the manufacturing method of the display device will be described in detail with reference to FIGS. 1 to 13.

FIGS. 3 to 13 are cross-sectional views showing the method of manufacturing the display device according to an exemplary embodiment.

Figure 3:
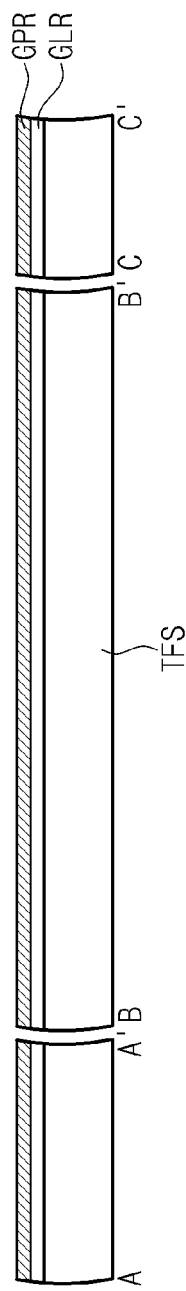
Figure 4:
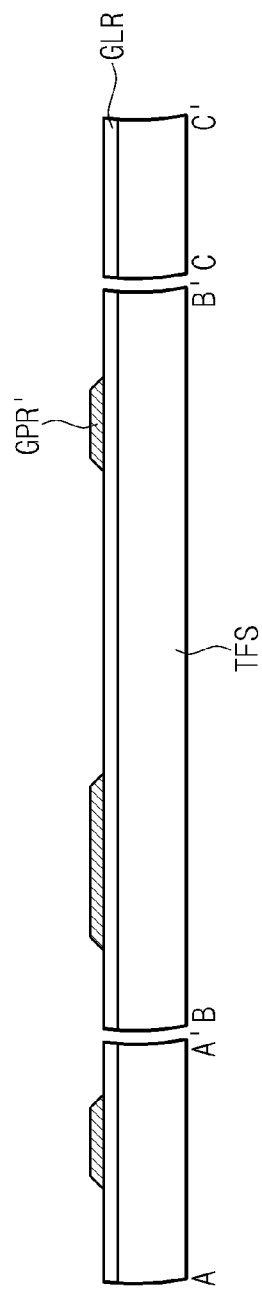
Figure 5:
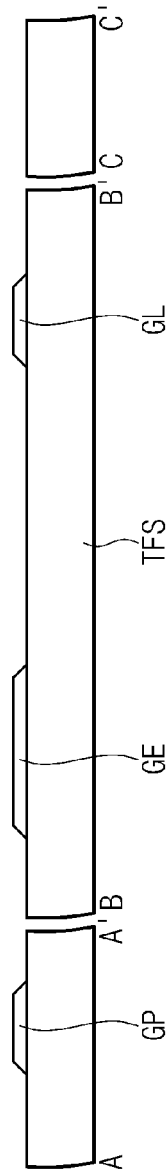

Referring to FIGS. 3 to 5, the gate line part GM is formed on the thin film transistor substrate TFS. The gate line part GM is formed by forming a conductive layer GLR on the thin film transistor substrate TFS and patterning the conductive layer GLR. Before the conductive layer GLR is formed on the thin film transistor substrate TFS, a cleaning process is performed on the thin film transistor substrate TFS to remove a foreign substance and an organic material from the thin film transistor substrate TFS and improve a contact property between the conductive layer GLR and the thin film transistor substrate TFS. Then, the conductive layer GLR for the gate line part GM is deposited on the thin film transistor substrate TFS through a sputtering process.

The conductive layer GLR may have a single-layer structure, a double-layer structure, or a triple-layer structure. When the conductive layer GLR has the double or greater than a double layer structure, one layer is formed of a material having a relatively small resistance and the other layer is formed of a material having superior contact property with respect to other materials, e.g., a double-layer structure of chromium (Cr) and aluminum (Al) or an aluminum alloy, a double-layer structure of aluminum (Al) and molybdenum (Mo).

Then, the above-mentioned photoresist composition is coated on the conductive layer GLR to form a photoresist layer GPR for the gate line part.

The laser beam is directed to the photoresist layer GPR so as to correspond to an area in which the gate line part GM is not formed. In the present exemplary embodiment, the photoresist composition is a positive type photoresist composition, the photoresist layer in the area, onto which the laser beam is directed and the gate line part GM is not formed, is removed by a development process, and the photoresist layer in the area remains, onto which the laser beam is not directed.

Accordingly, as shown in FIG. 4, a photoresist pattern GPR' is formed on the conductive layer GLR. The conductive layer GLR is etched using the photoresist pattern GPR' as a mask, and the gate line part GM is formed on the thin film transistor substrate TFS as shown in FIG. 5.

Figure 6:
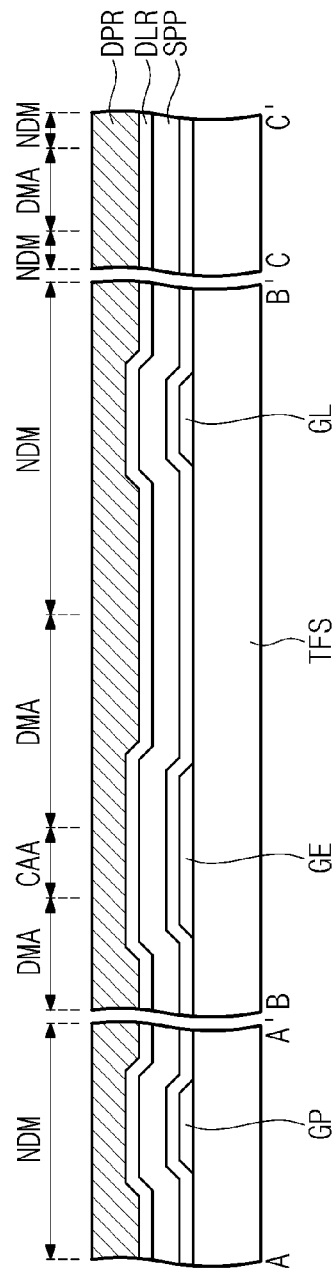

Referring to FIG. 6, the gate insulating layer GI, a preliminary semiconductor layer SPP, and a conductive layer DLR for the data line part DM are sequentially formed on the thin film transistor substrate TFS on which the gate line part GM is formed. The gate insulating layer GI, the preliminary semiconductor layer SPP, and the conductive layer DLR are deposited on the thin film transistor substrate TFS by a chemical vapor deposition ("CVD") method.

The conductive layer DLR may have a single-layer structure, a double-layer structure, or a triple-layer structure. When the conductive layer DLR has the double or a greater layer structure, one layer may be formed of a material having a relatively small resistance and the other layer may be formed of a material having superior contact property with respect to other materials, e.g., a double-layer structure of chromium (Cr) and aluminum (Al) or aluminum alloy, a double-layer structure of aluminum (Al) and molybdenum (Mo).

The preliminary semiconductor layer SPP includes at least one of hydro-amorphous silicon, polycrystalline silicon, an oxide semiconductor, an amorphous oxide semiconductor, a crystalline silicon semiconductor, or a polycrystalline silicon semiconductor. The oxide semiconductor includes at least one of indium (In), gallium (Ga), zinc (Zn), or tin (Sn). For instance, the preliminary semiconductor layer SPP includes the oxide semiconductor, such as, zinc oxide, tin oxide, indium oxide, indium-zinc (In—Zn) oxide, indium-tin (In—Sn) oxide, indium-gallium-zinc (In—Ga—Zn) oxide, indium-zinc-tin (In—Zn—Sn) oxide, indium-gallium-zinc-tin (In—Ga—Zn—Sn) oxide, etc.

Then, the photoresist composition is coated on the conductive layer DLR to form a photoresist layer DPR used to form the data line part DM. The laser beam is directed onto the photoresist layer DPR in an area NDM in which the data line part DM is not formed and a channel area CAA in which the channel portion CA is formed.

In this case, an amount of the laser beam directed onto the photoresist layer DPR in the channel area CAA is smaller than an amount of the laser beam directed onto the photoresist layer DPR in the area NDM. Accordingly, a decomposition amount of the photoresist composition in the channel area CAA is smaller than a decomposition amount of the photoresist composition in the area NDM in which the data line part DM is not formed.

To control the amount of the laser beam irradiated onto the photoresist layer DPR in the channel area CAA and the area NDM, a slit or lattice-shaped pattern or a semitransparent film is formed.

In addition, a line width of the pattern between the slits or a distance between the patterns, i.e., a width of the slit, is preferably smaller than a resolution of an exposure system. When the semitransparent film is used as a mask, a thin film may have different light transmittances or different thicknesses according to its positions.

In the present exemplary embodiment, the photoresist composition is the positive type photoresist composition, the photoresist layer DPR is removed from the area NDM, onto which the laser beam is directed and the data line part DM is not formed, and from a portion of the channel area CAA by a development process, and the photoresist layer DPR remains in an area in which the data line part DM is formed and in a portion of the channel area CAA, onto which the laser beam is not directed.

Thus, a photoresist pattern DPR' for the data line part DM and a channel pattern CAP may be formed, and the photoresist pattern DPR' may have a thickness greater than a thickness of the channel pattern CAP as shown in FIG. 7. For instance, the thickness of the channel pattern CAP may be equal to or smaller than a half of the thickness of the photoresist pattern DPR'.

Referring to FIG. 8, the conductive layer DLR and the preliminary semiconductor layer SPP may be etched using an etching gas without etching the photoresist pattern DPR' and the gate insulating layer GI.

Figure 9:
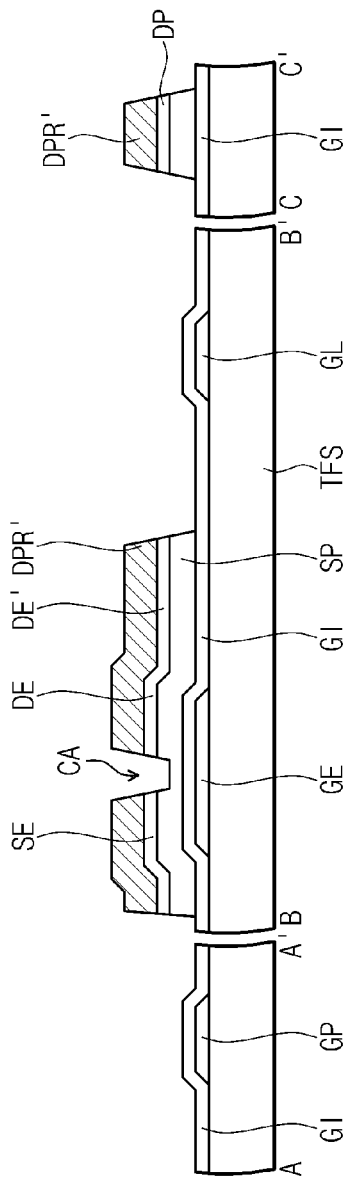

Then, referring to FIG. 9, the channel pattern CAP, a portion of the conductive layer DLR' corresponding to the channel area CAA, and a portion of the preliminary semiconductor layer SPP are etched using an etching gas to form the channel portion CA. As a result, the source electrode SE and the drain electrode DE are formed.

Figure 10:
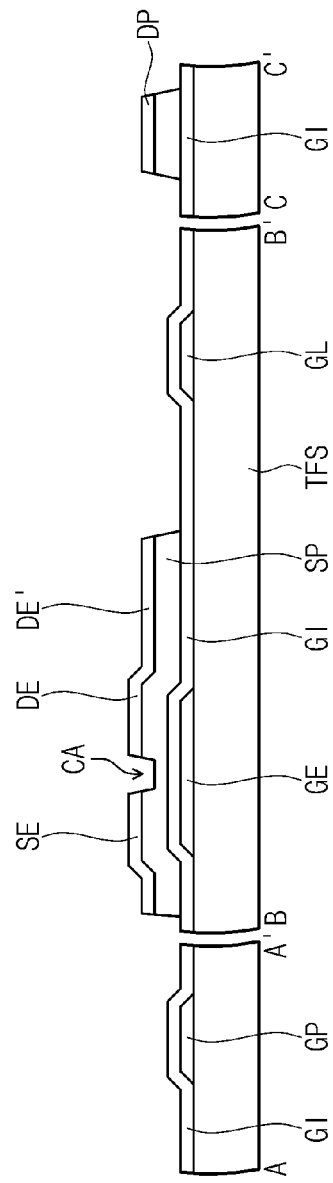

Referring to FIG. 10, the photoresist pattern DPR' used to form the data line part is striped, and thus the semiconductor layer SP and the data line part DM are formed.

The semiconductor layer SP and the data line part DM may be separately formed by different photolithography processes.

Figure 11:
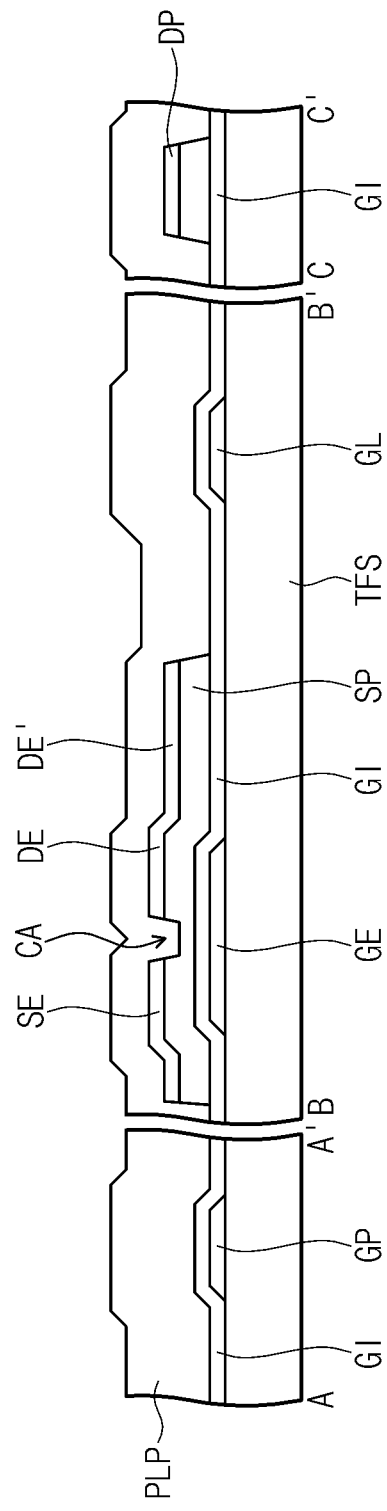
Figure 12:
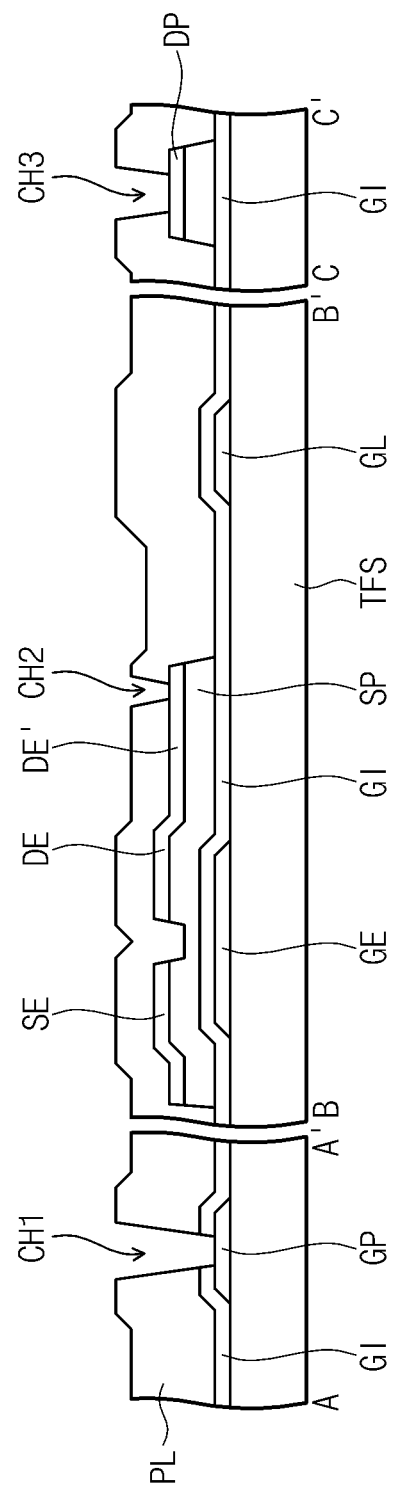

Referring to FIG. 11, a non-conductive layer PLP for the passivation layer PL is formed through a chemical vapor deposition method. Then, as shown in FIG. 12, the first contact hole CH1, the second contact hole CH2, and the third contact hole CH3 are formed using a photolithography process. In this case, the first contact hole CH1 is formed penetrating through the non-conductive layer PLP and the gate insulating layer GI to expose the portion of the gate pad GP. The second contact hole CH2 is formed penetrating through the non-conductive layer PLP to expose the expansion portion DE' of the drain electrode DE, and the third contact hole CH3 is formed penetrating through the non-conductive layer PLP to expose the portion of the data pad DP.

To this end, the non-conductive layer PLP is firstly etched to form a portion of the first contact hole CH1, the second contact hole CH2, and the third contact hole CH3, and then the portion of the gate insulating layer GI exposed through the portion of the first contact hole CH1 is etched, thereby forming the first, second, and third contact holes CH1, CH2, and CH3. Consequently, the passivation layer PL is formed.

Figure 13:
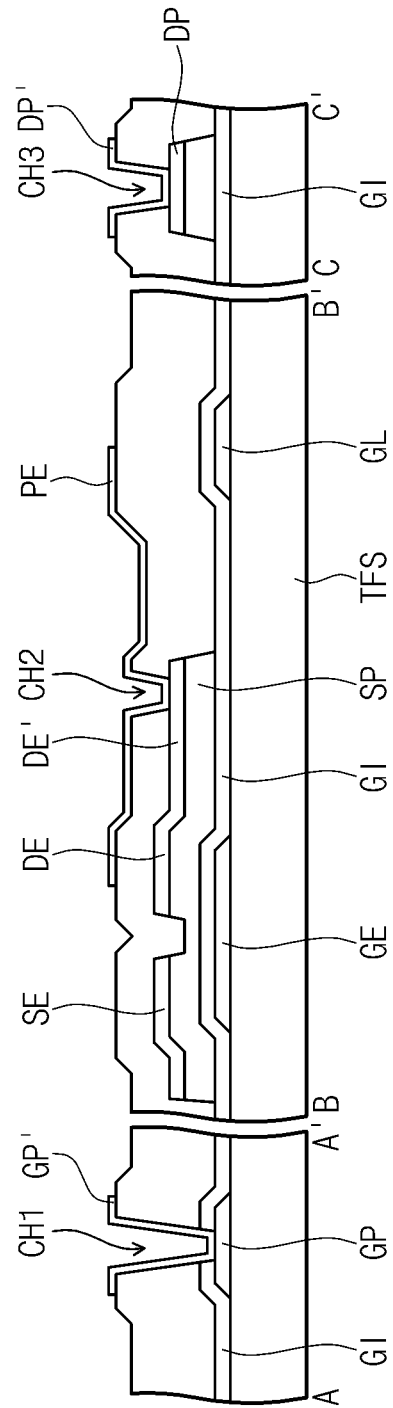

Then, a conductive layer (not shown) for the pixel electrode is formed on the passivation layer PL and patterned by a photolithography process, so that the pixel electrode PE, the auxiliary gate pad GP', and the auxiliary data pad DP' are formed, as shown in FIG. 13.

The liquid crystal layer LC is formed on the thin film transistor substrate TFS, and the color filter substrate CFS, on which the black matrix BM, the color filter CFL, and the common electrode CE are sequentially disposed, is formed on the liquid crystal layer LC. The color filter substrate CFS is formed on the liquid crystal layer LC such that the common electrode CE faces the passivation layer PL and the pixel electrode PE.

The following Embodiment Examples 1 to 3 and a Comparative Example 1 are simulated examples related to the effect of the solvent used in exemplary embodiments. In the following Embodiment and Comparative Examples, a percentage and a mixture ratio are based on the weight percent.

EMBODIMENT EXAMPLE 1

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. The solvent of about 70 grams has been prepared by mixing PGMEA and DMMGA at the weight ratio of 95:5. The binder resin, the diazide photosensitive initiator, and the solvent are mixed with each other to form the photoresist composition.

EMBODIMENT EXAMPLE 2

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. The solvent of about 70 grams has been prepared by mixing PGMEA and EEP at the weight ratio of 95:5. The binder resin, the diazide photosensitive initiator, and the solvent are mixed with each other to form the photoresist composition.

EMBODIMENT EXAMPLE 3

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. The solvent of about 70 grams has been prepared by mixing PGMEA and BA at the weight ratio of 95:5. BA has a boiling point of about 205 degrees Centigrade. The binder resin, the diazide photosensitive initiator, and the solvent are mixed with each other to form the photoresist composition.

COMPARATIVE EXAMPLE 1

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and the trimethylphenol at the weight ratio of 4:4:2. The diazide compound 1 of about 4 grams has been prepared as the diazide photosensitive initiator. PGMEA of about 70 grams has been prepared as the solvent. The binder resin, the diazide photosensitive initiator, and the solvent are mixed with each other to form the photoresist composition.

SIMULATED EXAMPLE 1

The photoresist compositions according to Embodiment Examples 1 to 3 and Comparative Example 1 have been spin-coated on a first substrate to form a photoresist layer on the first substrate with a thickness of about 1.40 micrometers. Then, a thickness uniformity of the photoresist layer has been measured and a vacuum dry (hereinafter, referred to as "VCD") process has been performed on the photoresist layer to dry the photoresist layer. In this case, a pressure in the chamber has been set to about 0.5 Torr or about 2.0 Torr. A critical dimension (hereinafter, referred to as CD) value is changed depending on the pressure in the chamber. Then, the exposure process has been performed on the photoresist layer, and the development process has been performed on the photoresist layer using an aqueous solution containing tetramethylammonium hydroxide during 60 seconds, 70 seconds, 80 seconds, and 90 seconds at a room temperature. The CD value becomes small in an area of the first substrate, in which the developing solution stays for a relatively long time, and the CD value becomes large in an area of the first substrate, in which the developing solution stays for a relatively short time.

Simulated Result 1

Figure 14:
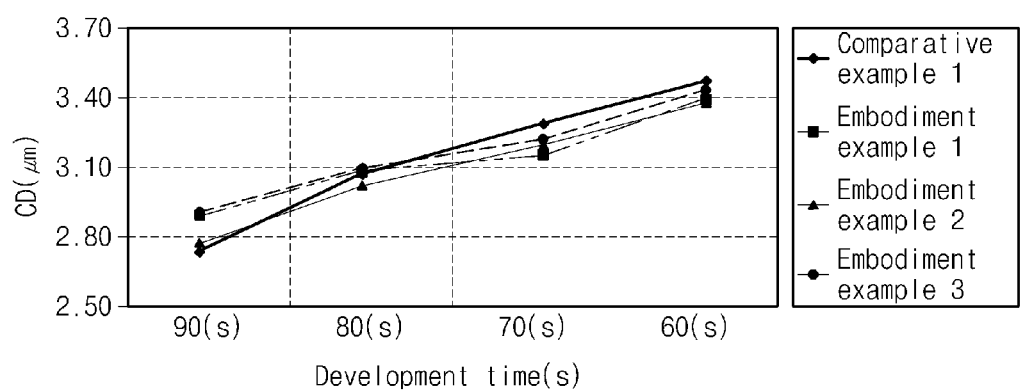
FIGS. 14 and 15 are graphs of critical dimension (micrometer, μm) versus development time (second, s) showing a critical dimension value as a function of a development time when a vacuum dry process is performed according to Embodiment Examples 1 to 3 and a Comparative Example 1 under a pump pressure of about 0.5 Torr and about 0.2 Torr, respectively.
Figure 15:
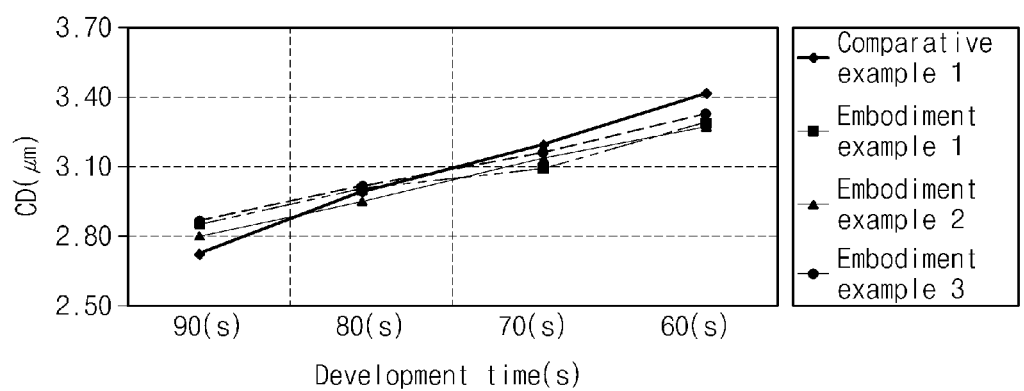

Table 1 and FIG. 14 show variations of the CD values according to the variation of development times after the pressure in the chamber is set to about 0.5 Torr and the VCD process is performed. In addition, Table 2 and FIG. 15 show variations of the CD values according to the variation of the development times after the pressure in the chamber is set to about 2.0 Torr and the VCD process is performed. The variations of the CD value are represented in terms of micrometer in Tables 1 and 2. Further, a slope in FIGS. 1 and 2 means a slope of a trend line.

FIGS. 14 and 15 are graphs showing the CD dimension value as a function of the development times when the vacuum dry process is performed on Embodiment Examples 1 to 3 and Comparative Example 1 on the condition that the pressure in a pump is at about 0.5 Torr and about 0.2 Torr.

TABLE 1

| Development time (s) | Embodiment Example 1 | Embodiment Example 2 | Embodiment Example 3 | Comparative Example 1 |
| --- | --- | --- | --- | --- |
| 90 (s) | 2.89 (μm) | 2.77 (μm) | 2.90 (μm) | 2.73 (μm) |
| 80 (s) | 3.08 (μm) | 3.02 (μm) | 3.09 (μm) | 3.07 (μm) |
| 70 (s) | 3.15 (μm) | 3.19 (μm) | 3.22 (μm) | 3.28 (μm) |
| 60 (s) | 3.39 (μm) | 3.38 (μm) | 3.43 (μm) | 3.47 (μm) |
| CD difference between maximum development time and minimum development time | 0.50 (μm) | 0.61 (μm) | 0.53 (μm) | 0.74 (μm) |
| slope | 0.157 | 0.200 | 0.172 | 0.243 |

TABLE 2

| Development time (s) | Embodiment Example 1 | Embodiment Example 2 | Embodiment Example 3 | Comparative Example 1 |
| --- | --- | --- | --- | --- |
| 90 (s) | 2.86 (μm) | 2.80 (μm) | 2.89 (μm) | 2.80 (μm) |
| 80 (s) | 3.04 (μm) | 2.98 (μm) | 3.00 (μm) | 2.97 (μm) |
| 70 (s) | 3.15 (μm) | 3.11 (μm) | 3.15 (μm) | 3.14 (μm) |
| 60 (s) | 3.33 (μm) | 3.38 (μm) | 3.38 (μm) | 3.46 (μm) |
| CD difference between maximum development time and minimum development time | 0.47 (μm) | 0.58 (μm) | 0.49 (μm) | 0.66 (μm) |
| slope | 0.152 | 0.187 | 0.162 | 0.215 |

Referring to Table 1 and FIG. 14, when the pressure in the chamber is set to about 0.5 Torr and the VCD process is performed, the variation of the CD value according to the development time is increased in order of Embodiment Example 1, Embodiment Example 3, Embodiment Example 2, and Comparative Example 1, i.e., Embodiment Example 1<Embodiment Example 3<Embodiment Example 2<Comparative Example 1. In addition, referring to Table 2 and FIG. 15, when the pressure in the chamber is set to about 2.5 Torr and the VCD process is performed, the variation of the CD value according to the development time is increased in order of Embodiment Example 1, Embodiment Example 3, Embodiment Example 2, and Comparative Example 1, i.e., Embodiment Example 1<Embodiment Example 3<Embodiment Example 2<Comparative Example 1.

This means that the photoresist composition in which the variation of the CD value is relatively small when the development time is changed is more superior than the photoresist composition in which the variation of the CD value is relatively large when the development time is changed. Therefore, the photoresist composition according to Embodiment Example 1 is most superior photoresist composition when the pressure in the chamber is set to about 0.5 Torr and about 2.0 Torr during the VCD process.

Accordingly, the CD margin of the photoresist composition when PGMEA is used as the base solvent and only DMMGA is used as the auxiliary solvent is greater than the CD margin of the photoresist composition when only BA or EEP is used as the auxiliary solvent or no auxiliary solvent is used.

That is, the CD margin during the VCD process of the photoresist composition when DMMGA is used as the auxiliary solvent is greater than the CD margin during the VCD process of the photoresist composition when DMMGA is not used as the auxiliary solvent.

SIMULATED EXAMPLE 2

The photoresist compositions according to Embodiment Examples 1 to 3 and the Comparative Example 1 have been spin-coated on the first substrate to form the photoresist layer on the first substrate with the thickness of about 1.40 micrometers. Then, the thickness uniformity of the photoresist layer has been measured and the VCD process performed to dry the photoresist layer has been omitted. In this case, reductions of the thickness of the photoresist layer in the hole portion have been measured after the soft bake process is performed at about 120 degrees Centigrade during about 90 seconds.

Simulated Result 2

Figure 16:
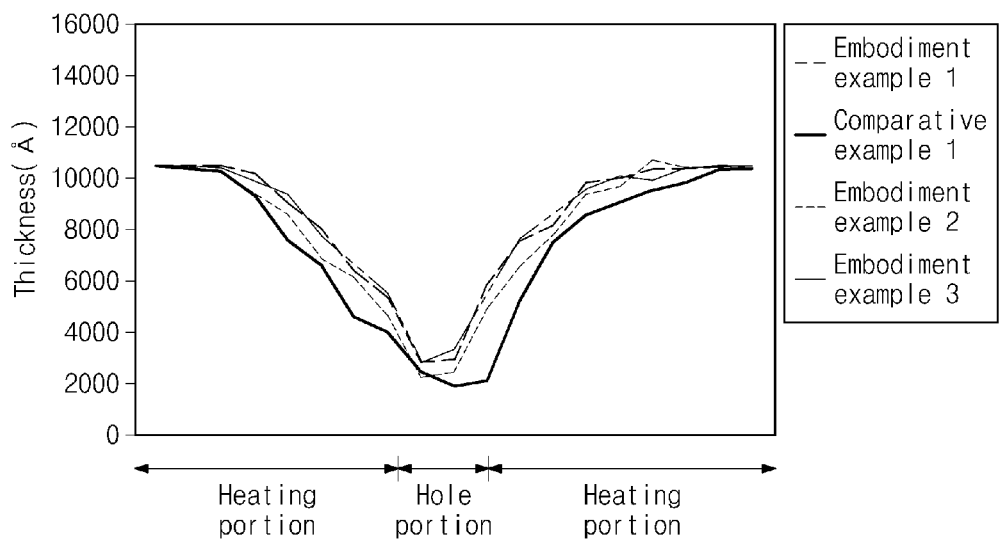
FIG. 16 is a graph of thickness (Angstrom, Å) versus a portion of the photoresist pattern showing a thickness of a photoresist layer in a heating portion and a hole portion of the photoresist pattern after a soft bake process has been performed according to Examples 1 to 3 and a Comparative Example 1.

FIG. 16 is a graph showing the thickness of the photoresist layer in a heating portion and a hole portion after the soft bake process is performed on Embodiment Examples 1 to 3 and the Comparative Example 1.

A difference between the thickness of the photoresist layer in the heat portion and the thickness of the photoresist layer in the hole portion in increased order of the photoresist compositions of Embodiment Examples 1 and 3, the photoresist composition of Embodiment Example 2, and the photoresist composition of Comparative Example 1, i.e., the photoresist compositions of Embodiment Examples 1 and 3<the photoresist composition of Embodiment Example 2< and the photoresist composition of Comparative Example 1. Accordingly, the CD margin of the soft bake process of the photoresist composition obtained by using DMMGA and BA having the high boiling point as the auxiliary solvent is greater than the CD margin of the soft bake process of the photoresist composition obtained by using only EEP as the auxiliary solvent or no auxiliary solvent.

That is, the CD margin of the soft bake process of the photoresist composition when DMMGA is used as the auxiliary solvent is greater than the CD margin of the soft bake process of the photoresist composition when DMMGA is not used as the auxiliary solvent.

As the difference between the thickness of the photoresist layer on the hole portion and the thickness of the photoresist layer on the heating portion becomes small, the degree of drying and contraction of the photoresist composition is reduced, and the photoresist composition is prevented from being deformed and stained during the photolithography process. Therefore, the photoresist composition and the display device are prevented from being deformed and stained when DMMGA is used as the auxiliary solvent than those of the photoresist composition and the display device when DMMGA is not used as the auxiliary solvent.

EMBODIMENT EXAMPLE 4

The binder resin of about 20 grams has been prepared by mixing the first novolac resin and the second novolac resin at the weight ratio of 80:20. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. PGMEA of about 70 grams has been prepared as the solvent. The binder resin, the diazide photosensitive initiator, and the solvent are mixed with each other to form the photoresist composition.

EMBODIMENT EXAMPLE 5

The binder resin of about 20 grams has been prepared by mixing the first novolac resin and the second novolac resin at the weight ratio of 50:50. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. PGMEA of about 70 grams has been prepared as the solvent. The binder resin, the diazide photosensitive initiator, and the solvent are mixed with each other to form the photoresist composition.

EMBODIMENT EXAMPLE 6

The binder resin of about 20 grams has been prepared by mixing the first novolac resin and the second novolac resin at the weight ratio of 20:80. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. PGMEA of about 70 grams has been prepared as the solvent. The binder resin, the diazide photosensitive initiator, and the solvent are mixed with each other to form the photoresist composition.

COMPARATIVE EXAMPLE 2

The first novolac resin of about 20 grams obtained by mixing meta-cresol and para-cresol at the weight ratio of 4:6 has been prepared as the binder resin. The diazide compound 1 of about 4 grams has been prepared as the diazide photosensitive initiator. PGMEA of about 70 grams has been prepared as the solvent. The binder resin, the diazide photosensitive initiator, and the solvent are mixed with each other to form the photoresist composition.

SIMULATED EXAMPLE 3

The photoresist compositions according to the Embodiment Examples 4 to 6 and Comparative Example 2 have been spin-coated on the first substrate to form the photoresist layer on the first substrate with the thickness of about 1.40 micrometers. Then, the thickness uniformity of the photoresist layer has been measured and the exposure process has been performed and the development process has been performed on the photoresist layer using the aqueous solution containing tetramethylammonium hydroxide during about 70 seconds at a room temperature.

Simulated Result 3

1) Depth of Focus (DOF) Margin

After the photoresist composition is exposed while a focal length of the exposure system is changed in a gravity direction, the development process is performed on the photoresist composition to form the pattern. Then, a size of the pattern, which is varied within a range of about 10% with reference to a size of the mask, is measured to show the variation of the focal length of the exposure system as shown in Table 3. As the DOF margin becomes large, the variation of the focal length becomes large. Therefore, although the exposure system shakes in the gravity direction, a stable pattern profile may be obtained.

2) Exposure Latitude (EL) Margin

After the photoresist composition is exposed while an exposure amount is varied, the development process is performed on the photoresist composition to form the pattern as shown in FIG. 3. As the EL margin becomes small, the variation of the CD value becomes small according to the variation of the exposure amount, and thus the pattern profile is more improved.

3) Pattern Profile and Critical Resolution

The pattern profile and the critical resolution are measured by an SEM and shown in Table 3. As the critical resolution becomes small, the pattern profile is more improved.

Table 3 shows the weight ratio between the first novolac resin and the second novolac resin, the DOF margin, the EL margin, and the critical resolution in Embodiment Examples 4 to 6 and the Comparative Example 2.

TABLE 3

| | Weight ratio between first and second novolac resins | DOF margin | EL margin | Critical resolution |
| --- | --- | --- | --- | --- |
| Embodiment Example 4 | 80:20 | 30 (μm) | 0.37 (μm) | 2.4 (μm) |
| Embodiment Example 5 | 50:50 | 40 (μm) | 0.32 (μm) | 2.2 (μm) |
| Embodiment Example 6 | 20:80 | 40 (μm) | 0.29 (μm) | 2.0 (μm) |
| Comparative Example 2 | 100:0 | 20 (μm) | 0.43 (μm) | 2.8 (μm) |

Referring to Table 3, the DOF margin is the greatest at about 40 micrometers in Embodiment Examples 5 and 6. The EL margin is the smallest at about 0.29 micrometers in Embodiment Example 6. Accordingly, the most pattern profile is obtained by Embodiment Example 6 in which the most content of the second novolac resin is contained. That is, the pattern profile is superior as the content of multi-substituted cresol and the content of para-cresol become increased.

The following Embodiment Example 7 and Comparative Example 3 are Simulated Examples to show effect of the photoresist composition according to the exemplary embodiment.

EMBODIMENT EXAMPLE 7

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. About 70 grams of the solution obtained by mixing PGMEA, DMMGA, and EEP at the weight ratio of 86:10:4 has been prepared as the solvent. The binder resin, the diazide photosensitive initiator, and the solvent are mixed with each other to form the photoresist composition.

COMPARATIVE EXAMPLE 3

The binder resin of about 20 grams has been prepared by mixing the first novolac resin and the second novolac resin at the weight ratio of 40:60. The first novolac resin has been obtained by mixing meta-cresol and para-cresol at the weight ratio of 4:6 and the second resin has been obtained by mixing meta-cresol, para-cresol, and trimethylphenol at the weight ratio of 4:4:2. The diazide compound 1 of about 4 grams has been prepared as the diazide photosensitive initiator. A solution of about 70 grams obtained by mixing PGMEA and BA at the weight ratio of 95:5 has been prepared as the solvent. The binder resin, the diazide photosensitive initiator, and the solvent are mixed with each other to form the photoresist composition.

SIMULATED EXAMPLE 4

The photoresist compositions according to Embodiment Examples 7 and Comparative Example 3 have been spin-coated on a glass substrate to form the photoresist layer on the glass substrate with the thickness of about 1.40 micrometers. Then, the thickness uniformity of the photoresist layer has been measured and the exposure process and the development process have been performed on the photoresist layer using the aqueous solution containing tetramethylammonium hydroxide during about 70 seconds at a room temperature.

Simulated Result 4

Figure 17:
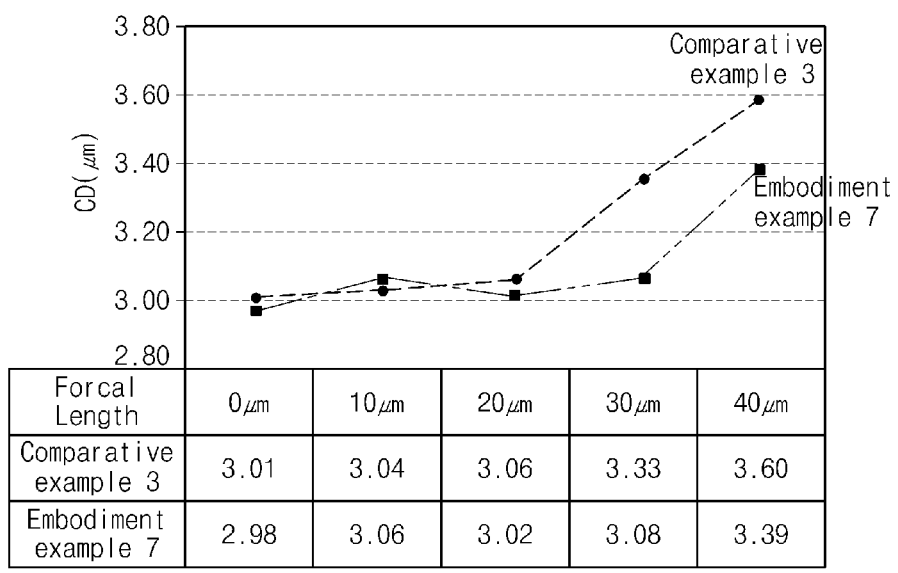
FIG. 17 is a graph of critical dimension (micrometer, μm) versus focal length (micrometer, μm) showing a critical dimension value when a focal length has been changed in an Embodiment Example 7 and a Comparative Example 3.
Figure 18:
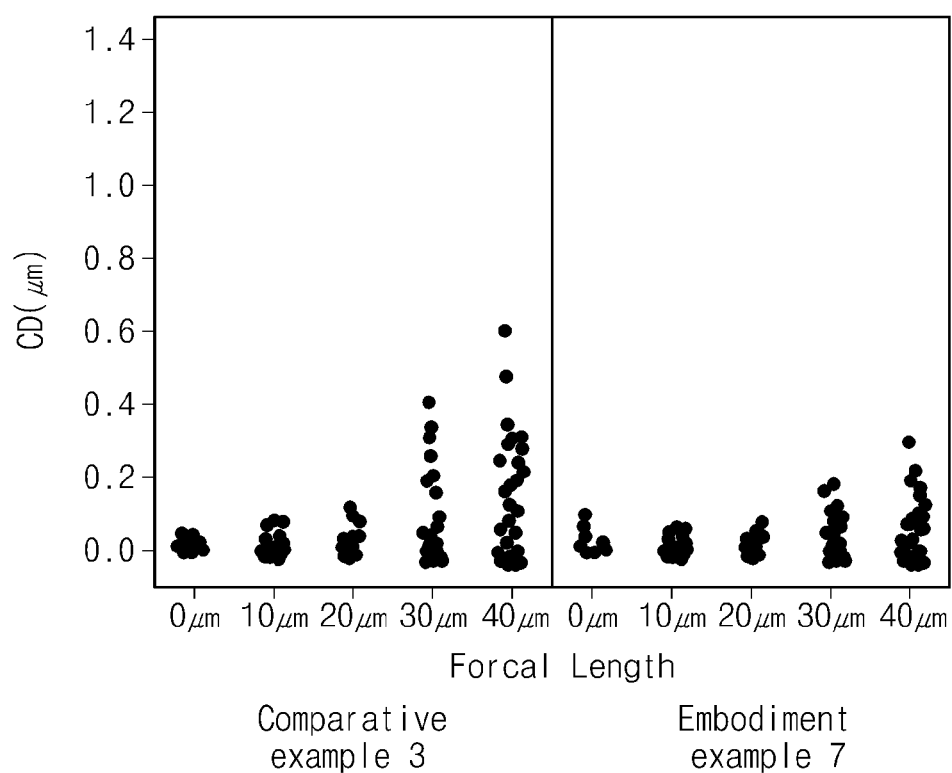
FIG. 18 is a graph of critical dimension (micrometer, μm) versus focal length (micrometer, μm) which is a distribution diagram showing a difference of the critical dimension value between micro-slit patterns when the focal length is changed according to Example 7 and the Comparative Example 3.

Table 4 and FIGS. 17 and 18 show pattern profiles formed by using the photoresist compositions manufactured by Embodiment Example 7 and Comparative Example 3.

FIG. 17 is a graph showing the critical dimension value when the focal length is changed in Embodiment Example 7 and Comparative Example 3, and FIG. 18 is a distribution diagram showing the difference of the critical dimension value between micro-slit patterns when the focal length is changed in Embodiment Example 7 and Comparative Example 3.

In Table 4, the difference of the CD value between micro-slit patterns indicates the CD value of the pattern spreading in about 45 degrees in direction and the CD value of the pattern spreading in about 135 degrees in direction when the micro-slits have an X shape. In this case, the pattern spreading about 45 degrees corresponds symmetrically to the pattern spreading in about 135 degrees. The difference of the CD value between micro-slit patterns is measured at 35 times at different areas. The maximum value in Table 4 refers to the maximum difference value between the CD value of the pattern spreading in about 45 degrees and that of about 135 degrees. As the CD value between the micro-slit patterns decreases, the pattern profile is more improved.

TABLE 4

| System | | Embodiment Example 7 Canon exposure system | Comparative Example 3 | Embodiment Example 7 compared to Comparative Example 3 |
|---|---|---|---|---|
| Sensitivity (mJ) | | 40 | 56 | Increased about 28% |
| DOF margin (μm) | | ±30 | ±20 | Improved about 10 (μm) |
| Difference between CD value of hole portion and CD value of heating portion (μm) | | 0.04 | 0.06 | Improved |
| CD value difference between micro-slit patterns | Average value | 0.02 | 0.03 | Improved |
| | Maximum value | 0.07 | 0.11 | Improved |

Referring to Table 4, when the photoresist pattern is formed using the photoresist composition according to the exemplary embodiment, the sensitivity of the photoresist composition is increased of about 28% when compared to that of another photoresist composition rather than the photoresist composition according to the present disclosure. In addition, the DOF margin is improved of about 10 micrometers and the difference between the CD value of the hole portion and the CD value of the heating portion is decreased to about 0.04 micrometers from about 0.06 micrometers, e.g., about 30%. Further, the average value of the CD value difference between micro-slit patterns is decreased to about 0.02 micrometers from about 0.03 micrometers and the maximum value of the CD value difference between the micro-slit patterns is decreased to about 0.07 micrometers from about 0.11 micrometers.

Referring to FIGS. 17 and 18, when the focal length of the exposure system is gradually increased, the CD value is rapidly changed at the focal length of about 30 micrometers in the Comparative Example 3, but the CD value is rapidly changed at the focal length of about 40 micrometers in the Embodiment Example 7. In addition, the distribution of the CD value difference between the micro-slit patterns increases at the focal length of about 30 micrometers in the Comparative Example 3, and the distribution of the CD value difference between the micro-slit patterns at the focal length of about 40 micrometers in the Embodiment Example 7 is smaller than that of the Comparative Example 3. Accordingly, the variation of the CD value of the Embodiment Example 7 is small than the variation of the CD value of the Comparative Example 3 with respect to the variation of the focal length of the exposure system, and thus the pattern profile may be more improved.

Thus, when the photoresist pattern is formed using the photoresist composition according to the exemplary embodiment, a desired photoresist pattern may be easily formed regardless of the capability of the exposure system. That is, the photoresist pattern formed using the photoresist composition according to the exemplary embodiment has excellent pattern profile. As a result, the resolution of the display device to which the photoresist composition is applied is increased and the stains may be prevented from occurring.

Although the exemplary embodiments have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A photoresist composition comprising:
a binder resin comprising a novolac resin represented by Chemical Formula 1;
a diazide photosensitive initiator; and
a solvent comprising
a base solvent and
an auxiliary solvent,
wherein the base solvent comprises propylene glycol monomethyl ether acetate and
wherein the auxiliary solvent comprises dimethyl-2-methylglutarate and ethyl beta-ethoxypropionate, Chemical Formula 1

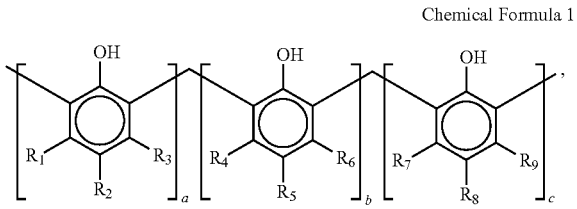

herein in Chemical Formula 1,
$R_1$ to $R_9$ are each independently a hydrogen atom or an alkyl group,
"a" is an integer number from 0 through 10,
"b" is an integer number from 0 through 100, and
"c" is an integer number from 1 through 10.

2. The photoresist composition of claim 1, wherein a content of the propylene glycol monomethyl ether acetate is about 70 weight % to about 90 weight %, a content of the dimethyl-2-methylglutarate is about 2 weight % to 15 weight %, and a content of the ethyl beta-ethoxypropionate is about 5 weight % to about 15 weight % based on a total of 100 weight % of the solvent.

3. The photoresist composition of claim 2, wherein the novolac resin comprises
a first novolac resin and
a second novolac resin,
wherein the first novolac resin is a product of polymerization of meta-cresol and para-cresol, and
wherein the second novolac resin is a product of polymerization of meta-cresol, para-cresol, and a trimethylphenol.

4. The photoresist composition of claim 3, wherein a content of meta-cresol is about 30 weight % to about 60 weight % and a content of para-cresol is about 40 weight % to about 70 weight % based on a total of 100 weight % of the first novolac resin.

5. The photoresist composition of claim 3, wherein a content of meta-cresol is about 30 weight % to about 60 weight %, a content of para-cresol is about 30 weight % to about 60 weight %, and a content of the trimethylphenol is about 10 weight % to about 40 weight % based on a total of 100 weight % of the second novolac resin.

6. The photoresist composition of claim 3, wherein a content of the first novolac resin is about 1 weight % to about 50 weight % and a content of the second novolac resin is about 50 weight % to about 99 weight % based on a total of 100 weight % of the novolac resin.

7. The photoresist composition of claim 3, wherein the diazide photosensitive initiator comprises 2,3,4,4'-tetrahydroxybenzophenone-1,2-naphtoquinone diazide-5-sulfonate.

8. The photoresist composition of claim 7, wherein the diazide photosensitive initiator further comprises 2,3,4-trihydroxybenzophenone-1,2-naphtoquinonediazide-5-sulfonate.

9. The photoresist composition of claim 7, wherein a content of the binder resin is about 10 weight % to about 38 weight %, a content of the diazide photosensitive initiator is about 2 weight % to about 10 weight %, and the content of the solvent is about 60 weight % to about 80 weight % based on a total of 100 weight % of the photoresist composition.

10. A method of manufacturing a display device, comprising:
forming a plurality of pixels on a thin film transistor substrate;
forming a liquid crystal layer on the thin film transistor substrate; and
forming a color filter substrate on the liquid crystal layer,
wherein forming a plurality of pixels comprises a photolithography process using a photoresist composition,
wherein the photoresist composition comprises:
a binder resin comprising a novolac resin represented by Chemical Formula 1;
a diazide photosensitive initiator; and
a solvent comprising
a base solvent and
an auxiliary solvent,
wherein
the base solvent comprises propylene glycol monomethyl ether acetate, and
the auxiliary solvent comprises dimethyl-2-methylglutarate and ethyl beta-ethoxypropionate, Chemical Formula 1

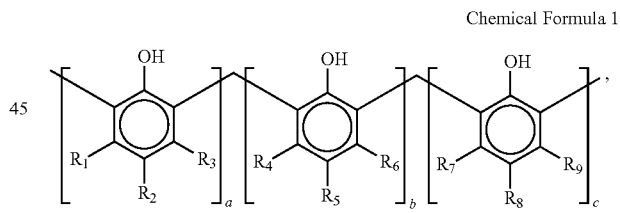

wherein in Chemical Formula 1,
$R_1$ to $R_9$ are each independently a hydrogen atom or an alkyl group,
"a" is an integer number from 0 through 10,
"b" is an integer number from 0 through 100, and
"c" is an integer number from 1 through 10.

11. The method of claim 10, wherein a content of the propylene glycol monomethyl ether acetate is about 70 weight % to about 90 weight %, a content of the dimethyl-2-methylglutarate is about 2 weight % to 15 weight %, and a content of the ethyl beta-ethoxypropionate is about 5 weight % to about 15 weight % based on a total of 100 weight % of the solvent.

12. The method of claim 11, wherein the novolac resin comprises
a first novolac resin and
a second novolac resin, wherein the first novolac resin is a product of polymerization of meta-cresol and para-cresol, and wherein the second novolac resin is a product of polymerization of meta-cresol, para-cresol, and a trimethylphenol.

13. The method of claim 12, wherein a content of meta-cresol is about 30 weight % to about 60 weight % and a content of para-cresol is about 40 weight % to about 70 weight % based on a total of 100 weight % of the first novolac resin.

14. The method of claim 12, wherein a content of meta-cresol is about 30 weight % to about 60 weight %, a content of para-cresol is about 30 weight % to about 60 weight %, and a content of the trimethylphenol is about 10 weight % to about 40 weight % based on a total of 100 weight % of the second novolac resin.

15. The method of claim 12, wherein a content of the first novolac resin is about 1 weight % to about 50 weight % and a content of the second novolac resin is about 50 weight % to about 99 weight % based on a total of 100 weight % of the novolac resin.

16. The method of claim 12, wherein the diazide photosensitive initiator comprises 2,3,4,4'-tetrahydroxybenzophenone-1,2-naphtoquinone diazide-5-sulfonate.

17. The method of claim 16, wherein the diazide photosensitive initiator further comprises 2,3,4-trihydroxybenzophenone-1,2-naphtoquinonediazide-5-sulfonate.

18. The method of claim 16, wherein a content of the binder resin is about 10 weight % to about 38 weight %, a content of the diazide photosensitive initiator is about 2 weight % to about 10 weight %, and the content of the solvent is about 60 weight % to about 80 weight % based on a total of 100 weight % of the photoresist composition.

19. The method of claim 18, wherein the photolithography process comprises:

forming a conductive or non-conductive layer on the thin film transistor substrate;

forming a photoresist layer on the conductive or non-conductive layer using the photoresist composition;

exposing and developing the photoresist layer to form a photoresist pattern; and etching the conductive or non-conductive layer using the photoresist pattern.

20. The method of claim 18, wherein the forming of the photoresist layer comprises removing a portion of the solvent by a soft bake process.

21. The method of claim 18, wherein the photoresist composition is a positive type photoresist composition, wherein the positive type photoresist composition undergoes a removal of an exposed portion of the photoresist layer after the photoresist layer is developed.

22. The method of claim 18, wherein each of the plurality of pixels comprises a gate electrode, a gate insulating layer, a semiconductor layer, a source electrode, a drain electrode, and a pixel electrode, wherein at least one of the gate electrode, the gate insulating layer, the semiconductor layer, the source electrode, the drain electrode, or the pixel electrode is a product of the photolithography process.

* * * * *